US010498326B2

(12) United States Patent
Wu et al.

(10) Patent No.: US 10,498,326 B2
(45) Date of Patent: Dec. 3, 2019

(54) OUTPUT DRIVER WITH POWER DOWN PROTECTION

(71) Applicant: Texas Instruments Incorporated, Dallas, TX (US)

(72) Inventors: Xiaoju Wu, Dallas, TX (US); Rajesh Keloth, Bangalore (IN); Sudheer Prasad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/386,252

(22) Filed: Dec. 21, 2016

(65) Prior Publication Data

US 2017/0257088 A1 Sep. 7, 2017

Related U.S. Application Data

(60) Provisional application No. 62/301,804, filed on Mar. 1, 2016.

(51) Int. Cl.
*H01L 29/78* (2006.01)
*H03K 17/08* (2006.01)
*H01L 27/02* (2006.01)
*H01L 29/06* (2006.01)
*H01L 29/417* (2006.01)
(Continued)

(52) U.S. Cl.
CPC ......... *H03K 17/08* (2013.01); *H01L 27/0262* (2013.01); *H01L 29/063* (2013.01); *H01L 29/41775* (2013.01); *H01L 29/7835* (2013.01); *H03K 17/08142* (2013.01); *H03K 17/6874* (2013.01); *H03K 2217/0018* (2013.01)

(58) Field of Classification Search
CPC . H03K 17/08; H01L 29/7835; H01L 27/0262; H01L 29/063; H01L 29/41775
See application file for complete search history.

(56) References Cited

U.S. PATENT DOCUMENTS 5,386,135 A * 1/1995 Nakazato ............ H01L 27/0214
257/296
5,719,490 A * 2/1998 Germini .................... G05F 3/24
307/80

(Continued)

OTHER PUBLICATIONS

Notification of Transmittal of the International Search Report and the Written Opinion of the International Searching Authority, or the Declaration dated Jun. 1, 2017.

*Primary Examiner* — Jung Kim
(74) *Attorney, Agent, or Firm* — Tuenlap Chan; Charles A. Brill; Frank D. Cimino

(57) ABSTRACT

An interface device includes an NPN structure along a horizontal surface of a p-doped substrate. The NPN structure has a first n-doped region coupled to an output terminal, a p-doped region surrounding the first n-doped region and coupled to the output terminal, and a second n-doped region separated from the first n-doped region by the p-doped region. The interface device also includes a PNP structure along a vertical depth of the p-doped substrate. The PNP structure includes the p-doped region, an n-doped layer under the p-doped region, and the p-doped substrate. Advantageously, the interface device can withstand high voltage swing (both positive and negative), prevent sinking and sourcing large load current, and avoid entering into a low resistance mode during power down operations.

16 Claims, 4 Drawing Sheets

(51) Int. Cl.
*H03K 17/0814* (2006.01)
*H03K 17/687* (2006.01)

(56) References Cited

U.S. PATENT DOCUMENTS

| | | |
|---|---|---|
| 6,781,423 B1 | 8/2004 | Knoedgen |
| 6,855,985 B2 | 2/2005 | Williams et al. |
| 8,093,924 B2 * | 1/2012 | Kamenicky ............... H03F 1/52 |
| | | 327/108 |
| 8,344,789 B2 * | 1/2013 | Webb ................... H03K 17/007 |
| | | 327/404 |
| 2005/0242399 A1 | 11/2005 | Huang |

* cited by examiner

OUTPUT DRIVER WITH POWER DOWN PROTECTION

CROSS REFERENCE TO RELATED APPLICATIONS

Under 35 U.S.C. § 119(e), this non-provisional application claims the benefit of priority to U.S. Provisional Application No. 62/301,804, filed on Mar. 1, 2016, the entirety of which is hereby incorporated by reference herein.

BACKGROUND

Integrated circuits and electronic devices include driver circuits for interfacing between two or more systems that operate in different voltage ranges. A driver circuit typically includes an output driver to provide both high-side (HS) and low-side (LS) operations. In particular, an output driver may include a HS driver circuit and a LS driver circuit. The HS driver circuit is configured to deliver a HS output (e.g., a VDD+ voltage) at an output terminal, whereas the LS driver circuit is configured to deliver a LS output (e.g., a VDD- voltage) at the output terminal. During a power down mode, neither the HS driver circuit nor the LS driver circuit is enabled. Yet, the output terminal may receive a high voltage ramp from a load. The high voltage ramp may be positive or negative, can be greater than the output voltages. If the driver circuit is unprotected, the high voltage may cause damage to the LS driver circuit and the load.

SUMMARY

The present disclosure provides a solution for protecting driver circuits from high voltage ramps during power down modes. The disclosed solution includes a low-side driver circuit that has a parasitic bipolar structure with a high breakdown voltage. The high breakdown voltage suppresses latch up effects of a parasitic silicon-controlled rectifier (SCR) structure. Advantageously, the disclosed low-side driver can withstand high voltage swing (both positive and negative), prevent sinking and sourcing large load current, and avoid entering into a low resistance mode during power down operations.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
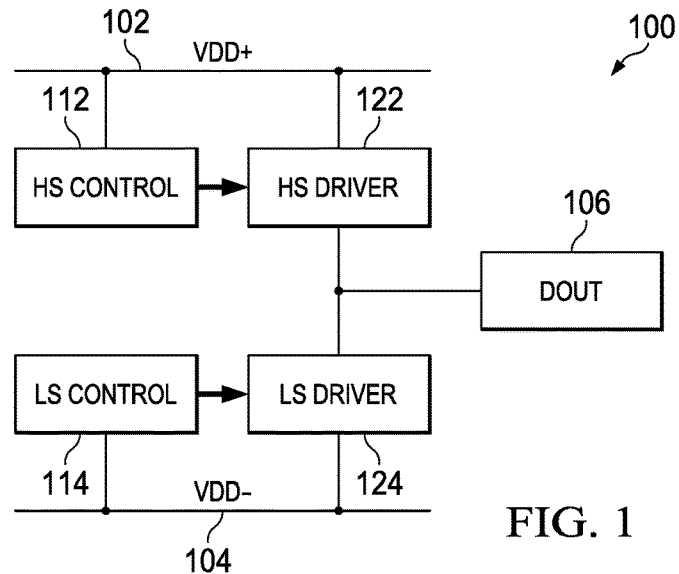
FIG. 1 shows a schematic view of an interface device according to an aspect of the present disclosure.

FIG. 1 shows a schematic view of an interface device 100 according to an aspect of the present disclosure. The interface device 100 is configured to receive supply voltages from a high-side (HS) voltage supply terminal 102 and a low-side (LS) voltage supply terminal 104. In one implementation, for instance, the HS voltage supply terminal 102 is configured to receive a HS voltage VDD+ ranging from 2V to 7V, whereas the LS voltage supply terminal 104 is configured to receive a LS voltage VDD- ranging from -7V to -2V. The interface device 100 is configured to generate an output between the HS voltage (e.g., VDD+) and the LS voltage (e.g., VDD-) based on an input. The output is delivered to the output terminal 106. A load can be coupled to the output terminal 106 to receive the output of the interface device 100. The load can be an internal load, which is a part of an integrated circuit that incorporates the interface device 100. Alternatively, the load can be an external load for integration with the interface device 100.

The interface device 100 includes a HS control circuit 112, a LS control circuit 114, a HS driver circuit 122, and a LS driver circuit 124. The circuits 112, 114, 122, and 124 may be fabricated into an integrated circuit die. Alternatively, the circuits 112, 114, 122, and 124 may be discrete components for incorporation onto a printed circuit board. The HS control circuit 112 is coupled to the HS voltage supply terminal 102, whereas the LS control circuit 114 is coupled to the LS voltage supply terminal 104. Based upon an input provided to the interface device 100, the HS control circuit 112 controls the operation of the HS driver circuit 122, and the LS control circuit 114 controls the operation of the LS driver circuit 124. For instance, when the HS control circuit 112 activates the HS driver circuit 122, the HS driver circuit 122 delivers the HS voltage (e.g., VDD+ at about +5.5V) to the output terminal 106. Likewise, when the LS control circuit 114 activates the LS driver circuit 124, the LS driver circuit 124 delivers the LS voltage (e.g., VDD- at about -5.5V) to the output terminal 106.

During a power down mode, neither the HS control circuit 112 nor the LS control circuit 114 is driving the HS driver circuit 122 or the LS driver circuit 124. Nevertheless, the output terminal 106 may receive a voltage ramp from a load. In certain situations, the magnitude of the voltage ramp may exceed the magnitude of either one of the HS supply voltage or the LS supply voltage by a substantial margin (e.g., greater than 50%). For example, the voltage ramp received at the output terminal 106 may ranges from +12V to -12V where the HS supply voltage is at +5V and the LS supply voltage is at -5V. Facing a high voltage ramp, the LS driver circuit 124 may enter into a breakdown mode, thereby conducting a high current from the output terminal 106 and the load.

Figure 2A:
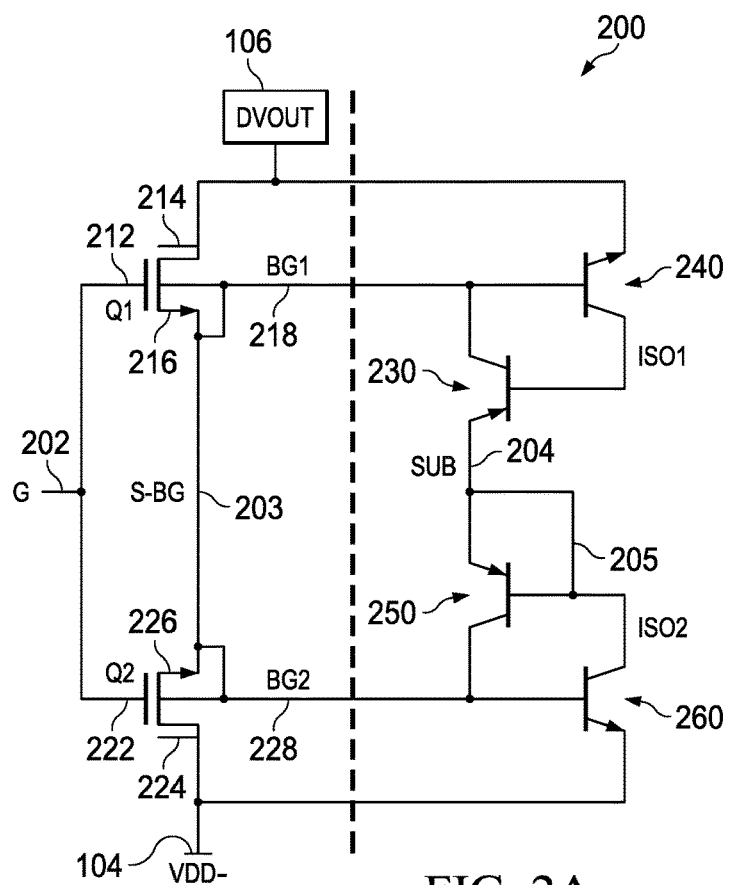
FIG. 2A shows a schematic view of a low-side (LS) driver circuit according to an aspect of the present disclosure.

FIG. 2A shows a schematic view of an exemplary low-side (LS) driver circuit 200 according to an aspect of the present disclosure. The LS driver circuit 200 may be used for implementing the LS driver circuit 124 as shown and described in FIG. 1. In general, the LS driver circuit 200 includes an LS input terminal 202, a first transistor Q1, and a second transistor Q2. The first transistor Q1 has a control gate 212 coupled to the LS input terminal 202, a first terminal 214 coupled to the output terminal 106, a second terminal 216 coupled to a floating connection (floating lead) 203, and a back gate terminal 218 coupled to the second terminal 216. The first transistor Q1 can be implemented by an N-channel metal oxide semiconductor (NMOS) transistor and/or an N-channel drain extended MOS (DENMOS) transistor. If the first transistor Q1 is implemented by an NMOS transistor, its drain region can be accessed via the first terminal 214, its source region can be accessed via the second terminal 216, and its body region can be accessed via the back gate terminal 218.

Likewise, the second transistor Q2 has a control gate 222 coupled to the LS input terminal 202, a first terminal 224 coupled to the LS voltage supply terminal 104, a second terminal 226 coupled to the floating connection 203, and a back gate terminal 228 coupled to the second terminal 226. The second transistor Q2 can be implemented by an N-channel metal oxide semiconductor (NMOS) transistor and/or an N-channel drain extended MOS (DENMOS) transistor. If the second transistor Q2 is implemented by an NMOS transistor, its drain region can be accessed via the first terminal 224, its source region can be accessed via the second terminal 226, and its body region can be accessed via the back gate terminal 228.

Via the floating connection 203, the source region (via the second terminal 216) of the first transistor Q1 is coupled to the source region (via the second terminal 226) of the second transistor Q2. And via the floating connection 203, the body region (via the back gate terminal 218) of the first transistor Q1 is coupled to the body region (via the back gate terminal 228) of the second transistor Q2.

The first transistor Q1 and the second transistor Q2 are each associated with a parasitic silicon-control rectifier (SCR) structure (i.e., right side of the vertical dotted line). These parasitic SCR structures may affect the power down operations of the LS driver circuit 200. The first parasitic SCR structure includes a parasitic PNP structure 230 and a parasitic NPN structure 240, both of which are associated with the first transistor Q1. The parasitic PNP structure 230 includes a p-type collector coupled to the back gate terminal 218, an n-type base floating in a first isolation lead ISO1, and a p-type emitter formed in a p-type substrate 204. The parasitic NPN structure 240 includes an n-type emitter coupled to the output terminal 106, a p-type base joining the p-type collector of the parasitic PNP structure 230, and an n-type collector joining the n-type base of the PNP structure 230 by floating in the first isolation lead ISO1.

The second parasitic SCR structure includes a parasitic PNP structure 250 and a parasitic NPN structure 260, both of which are associated with the second transistor Q2. The parasitic PNP structure 250 includes a p-type collector coupled to the back gate terminal 228, an n-type base coupled to a second isolation lead ISO2, and a p-type emitter formed in the p-type substrate 204 and coupled to its n-type base. The parasitic NPN structure 260 includes an n-type emitter coupled to the LS voltage supply terminal 104, a p-type base joining the p-type collector of the parasitic PNP structure 230, and an n-type collector joining the n-type base of the PNP structure 250, both of which are coupled to the second isolation lead ISO2.

Figure 2B:
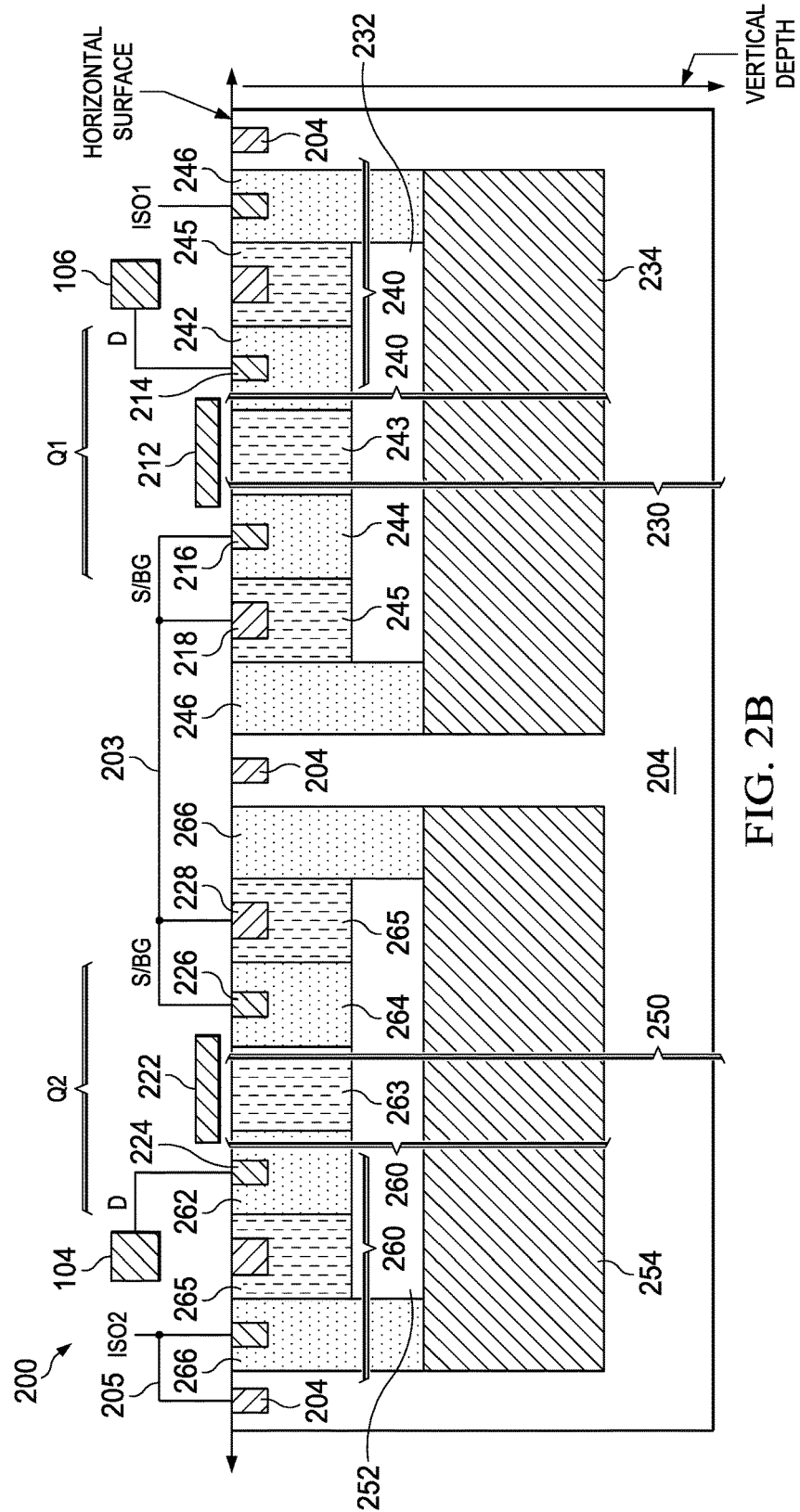
FIG. 2B shows a cross-sectional view of the LS driver circuit device according to an aspect of the present disclosure.

FIG. 2B shows a cross-sectional view of the LS driver circuit 200, which may better illustrate the structural relationship among the above referenced parasitic structures. The LS driver circuit 200 is formed on a p-doped substrate 204, which has a horizontal surface and a vertical depth extending perpendicularly to the horizontal surface. The first transistor Q1 includes an NPN structure along the horizontal surface. The NPN structure includes a first n-doped region 242, a first p-doped region 243, and a second n-doped region 244. The first transistor Q1 also includes a second p-doped region (a p-doped side region) 245 laterally surrounding the first n-doped region 242 and the second n-doped region 244 with the first p-doped region 243. The first p-doped region 243 may be formed simultaneously with the second p-doped region 245 as a single p-doped region.

Moreover, the first transistor Q1 includes a p-doped layer 232 supporting and connecting the first p-doped region 243 and the second p-doped region 245. The p-doped layer 232 is a p-type buried layer (PBL) that can be formed by ion implantation or by epitaxial growth. Together, the first p-doped region 243, the second p-doped region 245, and the p-doped layer 232 form a single p-doped region (or a p-well), in which the first and second n-doped regions 242 and 244 are positioned, and by which the first and second n-doped regions 242 and 244 are separated.

Furthermore, the first transistor Q1 includes an n-type isolation structure that isolates the p-doped region (e.g., the first p-doped region 243, the second p-doped region 245, and the p-doped layer 232) from the second transistor Q2 and the substrate 204. The n-type isolation structure includes an n-doped layer 234 and an n-doped side wall 246. The n-doped layer 234 is positioned under the p-doped layer 232. The n-doped layer 234 is an n-type buried layer (NBL) that can be formed by ion implantation or by epitaxial growth. The n-doped side wall 246 laterally surrounds the p-doped region including the second p-doped region 245 and the p-doped layer 232. Abutting the n-doped layer 234 underneath, the n-doped side wall 246 forms an isolation well structure in which the p-doped region (e.g., 243, 245, and 232) is positioned.

Likewise, the second transistor Q2 includes an NPN structure along the horizontal surface. The NPN structure of the first transistor Q1 is adjacent to and spaced apart from the NPN structure of the first transistor Q1. The NPN structure of the second transistor Q2 includes a first n-doped region 262, a first p-doped region 263, and a second n-doped region 264. The second transistor Q2 also includes a second p-doped region (a p-doped side region) 265 laterally surrounding the first n-doped region 262 and the second n-doped region 264 with the first p-doped region 263. The first p-doped region 263 may be formed simultaneously with the second p-doped region 265 as a single p-doped region.

Moreover, the second transistor Q2 includes a p-doped layer 252 supporting and connecting the first p-doped region 263 and the second p-doped region 265. The p-doped layer 252 is a p-type buried layer (PBL) that can be formed by ion implantation or by epitaxial growth. Together, the first p-doped region 263, the second p-doped region 265, and the p-doped layer 252 form a single p-doped region (or a p-well), in which the first and second n-doped regions 262 and 264 are positioned, and by which the first and second n-doped regions 262 and 264 are separated.

Furthermore, the second transistor Q2 includes an n-type isolation structure that isolates the p-doped region (e.g., the first p-doped region 263, the second p-doped region 265, and the p-doped layer 252) from the first transistor Q1 and from the substrate 204. The n-type isolation structure includes an n-doped layer 254 and an n-doped side wall 266, both of which are spaced apart from the n-type isolation structure of the first transistor Q1. The n-doped layer 254 is positioned under the p-doped layer 252. The n-doped layer 254 is an n-type buried layer (NBL) that can be formed by ion implantation or by epitaxial growth. The n-doped side wall 266 laterally surrounds the p-doped region including the second p-doped region 265 and the p-doped layer 252. Abutting the n-doped layer 254 underneath, the n-doped side wall 266 forms an isolation well structure in which the p-doped region (e.g., 263, 265, and 252) is positioned.

Referring again to the first transistor Q1, the first n-doped region 242 is coupled to the output terminal 106 via the first terminal 214, which can be fabricated as an n-doped silicide contact. The second n-doped region 244 is coupled to the floating connection (floating lead) 203 via the second terminal 216, which can be fabricated as an n-doped silicide contact. The p-doped region, such as the second p-doped region 245, is coupled to the floating connection 203 via the back gate terminal 218, which can be fabricated as a p-doped silicide contact. Via the floating connection 203, the second n-doped region 244 is coupled to the p-doped region (e.g., 243, 245, and 232). The n-type isolation structure (e.g., 246 and 234) can be accessed via a first isolation terminal ISO1, which can be fabricated as an n-doped silicide contact.

In an implementation where the first transistor Q1 is an NMOS transistor, the first n-doped region 242 serves as a drain region, the second n-doped region 244 serves as a source region, the first p-doped region 243 serves as a channel region under the control gate 212 and between the drain and source regions, and the second p-doped region 245 serves as a back gate region alongside with the p-doped layer 232. In another implementation where the first transistor Q1 is a DENMOS transistor, the first n-doped region 242 serves as a drain extended region, the second n-doped region 244 serves as a source region, the first p-doped region 243 serves as a channel region under the control gate 212 and between the drain and source regions, and the second p-doped region 245 serves as a back gate region alongside with the p-doped layer 232, which may optionally serves to enhance a reduce surface field (RESURF) region.

The first transistor Q1 is embedded with a parasitic SCR structure including a parasitic PNP structure 230 and a parasitic NPN structure 240. The parasitic PNP structure 230 is established along the vertical depth of the substrate 204. The parasitic PNP structure 230 has a collector region in the p-doped region (e.g., 243 and 232), a base region in the n-type isolation structure (e.g., 234), and an emitter region in the p-doped substrate 204. The parasitic NPN structure 240 is established along the vertical depth and/or the horizontal surface of the substrate 204. The parasitic NPN structure 240 includes a collector region in the n-type isolation structure (e.g., 234 and 246), a base region in the p-doped region (e.g., 232 and 245), and an emitter region in the first n-doped region 242.

Referring back to the second transistor Q2, the first n-doped region 262 is coupled to the LS voltage supply terminal 104 via the first terminal 224, which can be fabricated as an n-doped silicide contact. The second n-doped region 264 is coupled to the floating connection 203 via the second terminal 226, which can be fabricated as an n-doped silicide contact. The p-doped region, such as the second p-doped region 265, is coupled to the floating connection 203 via the back gate terminal 228, which can be fabricated as a p-doped silicide contact. Through the floating connection 203, the second n-doped region 264 is coupled to the p-doped region (e.g., 263, 265, and 262). And through the floating connection 203, the second n-doped region 244 and the p-doped region 245 of the first transistor Q1 is coupled to the second n-doped region 264 and the p-doped region 265 of the second transistor Q2. The n-type isolation structure (e.g., 266 and 254) can be accessed via a second isolation terminal ISO2, which can be fabricated as an n-doped silicide contact. In one implementation, the second isolation terminal ISO2 may be connected to a ground voltage supply terminal to receive a ground voltage (e.g., 0V).

In an implementation where the second transistor Q2 is an NMOS transistor, the first n-doped region 262 serves as a drain region, the second n-doped region 264 serves as a source region, the first p-doped region 263 serves as a channel region under the control gate 222 and between the drain and source regions, and the second p-doped region 265 serves as a back gate region alongside with the p-doped layer 252. In another implementation where the second transistor Q2 is a DENMOS transistor, the first n-doped region 262 serves as a drain extended region, the second n-doped region 264 serves as a source region, the first p-doped region 263 serves as a channel region under the control gate 222 and between the drain and source regions, and the second p-doped region 265 serves as a back gate region alongside with the p-doped layer 252, which may optionally serves as to enhance a reduce surface field (RESURF) region.

The second transistor Q2 is embedded with a parasitic SCR structure including a parasitic PNP structure 250 and a parasitic NPN structure 260. The parasitic PNP structure 250 is established along the vertical depth of the substrate 204. The parasitic PNP structure 250 has a collector region in the p-doped region (e.g., 263 and 252), a base region in the n-type isolation structure (e.g., 254), and an emitter region in the p-doped substrate 204. The parasitic NPN structure 260 is established along the vertical depth and/or the horizontal surface of the substrate 204. The parasitic NPN structure 260 includes a collector region in the n-type isolation structure (e.g., 254 and 266), a base region in the p-doped region (e.g., 252 and 265), and an emitter region in the first n-doped region 262.

During a power down mode, the output terminal 106 may receive a positive voltage ramp or a negative voltage ramp. The configuration of the LS driver circuit 200 can sustain a relatively large positive voltage ramp (e.g., +10V) at the output terminal 106. This is because a junction between the first n-doped region 242 and the p-doped region (e.g. 243, 245, and 232) of the first transistor Q1 is in reverse bias. And because the p-doped region is floating, the junction voltage will not exceed the breakdown voltage of the junction.

However, when the output terminal 106 receives a relatively large negative voltage ramp (e.g., −10V), the LS driver circuit 200 may begin to conduct a current. This is because the base regions of the parasitic PNP structure 230 and the parasitic NPN structure 240 are both floating. Within the parasitic NPN structure 240, the floating p-base region (e.g., 243, 245, and 232) may follow the negative voltage ramp from the first n-doped region 242. For example, if the first n-doped region 242 is at −10V, the p-base region may follow to −9V. Within the parasitic PNP structure 230, the n-base region (e.g., 234 and 246) is floated at a voltage (e.g., −1V) between the p-doped layer 232 (e.g., −9V) and the p-doped substrate 204 (e.g., 0V). The open-base breakdown voltage ($BV_{CEO}$) is relatively low (e.g., 5.5V) for both the parasitic PNP structure 230 and the parasitic NPN structure 240. As such, the parasitic PNP structure 230 is turned on with a collector-base current gain (HFE) at about 1, while the parasitic NPN structure 240 is turned on with an HFE at about 50. The parasitic SCR structure is thus triggered with a positive feedback, which leads to a latch-up condition in the LS driver circuit 200.

Figure 3A:
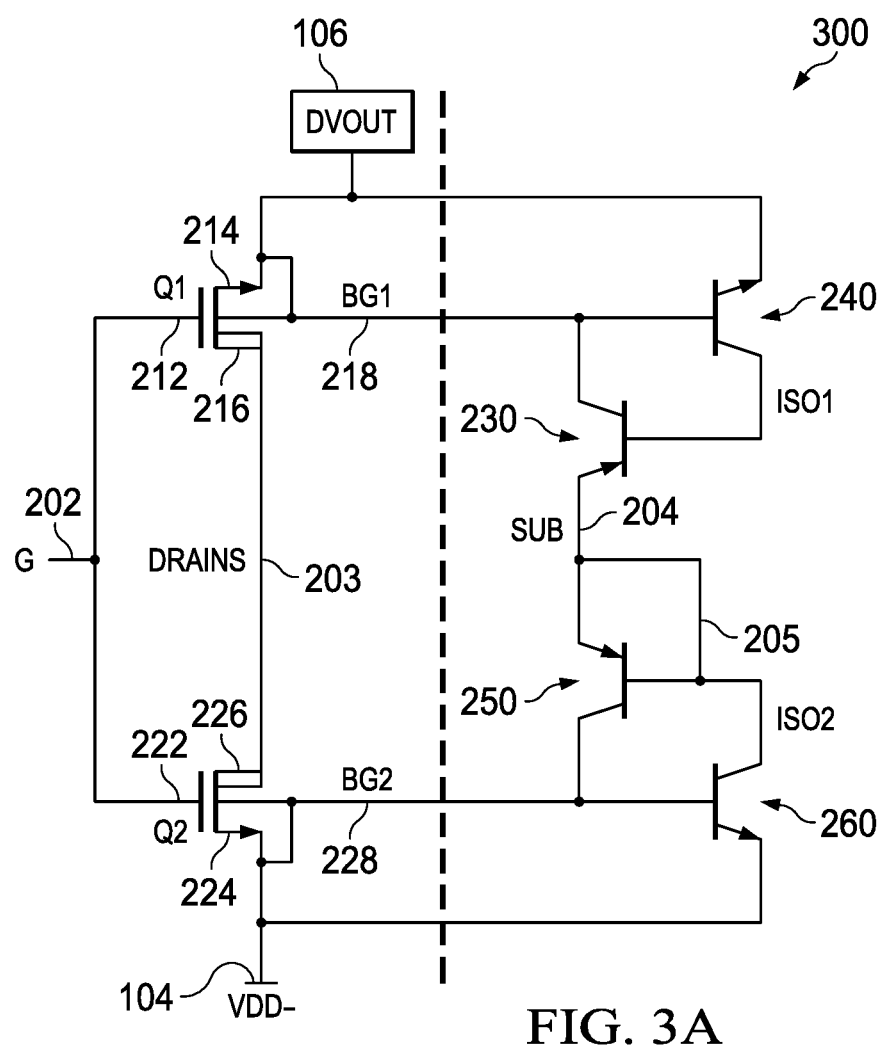
FIG. 3A shows a schematic view of an LS driver circuit with power down protection according to an aspect of the present disclosure.

To prevent the latch-up condition during a power down mode, the present disclosure provides a modified LS driver circuit that can suppress the positive feedback of the parasitic SCR structure. FIG. 3A shows a schematic view of an exemplary LS driver circuit 300 with power down protection. Like the LS driver 200, the LS driver circuit 300 may be used for implementing the LS driver circuit 124 as shown and described in FIG. 1. The LS driver circuit 300 includes the same components with the same numeric references as the LS driver circuit 200. The LS driver circuit 300 is different from the LS driver circuit 200 in that the drain-source arrangement of each of the first transistor Q1 and the second transistor Q2 is reversed.

More specifically regarding the first transistor Q1, the first terminal 214 is rearranged to access the source region instead of the drain region (or extended drain region if the first transistor Q1 is a DEMOS transistor), whereas the second terminal 216 is rearranged to access the drain region (or extended drain region if the first transistor Q1 is a DEMOS transistor) instead of source region. To that end, the back gate terminal 218 is coupled to the first terminal 214 instead of the second terminal 216. Because of this rearrangement, the back gate terminal 218 is no longer floating with the floating connection 203. Rather, the back gate terminal 218 is coupled to the output terminal 106.

Regarding the second transistor Q2, the first terminal 224 is rearranged to access the source region instead of the drain region (or extended drain region if the first transistor Q1 is a DEMOS transistor), whereas the second terminal 226 is rearranged to access the drain region (or extended drain region if the second transistor Q2 is a DEMOS transistor) instead of a source region. To that end, the back gate terminal 228 is coupled to the first terminal 224 instead of the second terminal 226. Because of this rearrangement, the back gate terminal 228 is no longer floating with the floating connection 203. Rather, the back gate terminal 228 is coupled to the LS voltage supply terminal 104. With this reconfiguration, the floating connection 203 is connected to the drain regions of the first transistor Q1 and the second transistor Q2. As such, the drain regions of the first and second transistors Q1 and Q2 are configured to float during the power down mode.

Figure 3B:
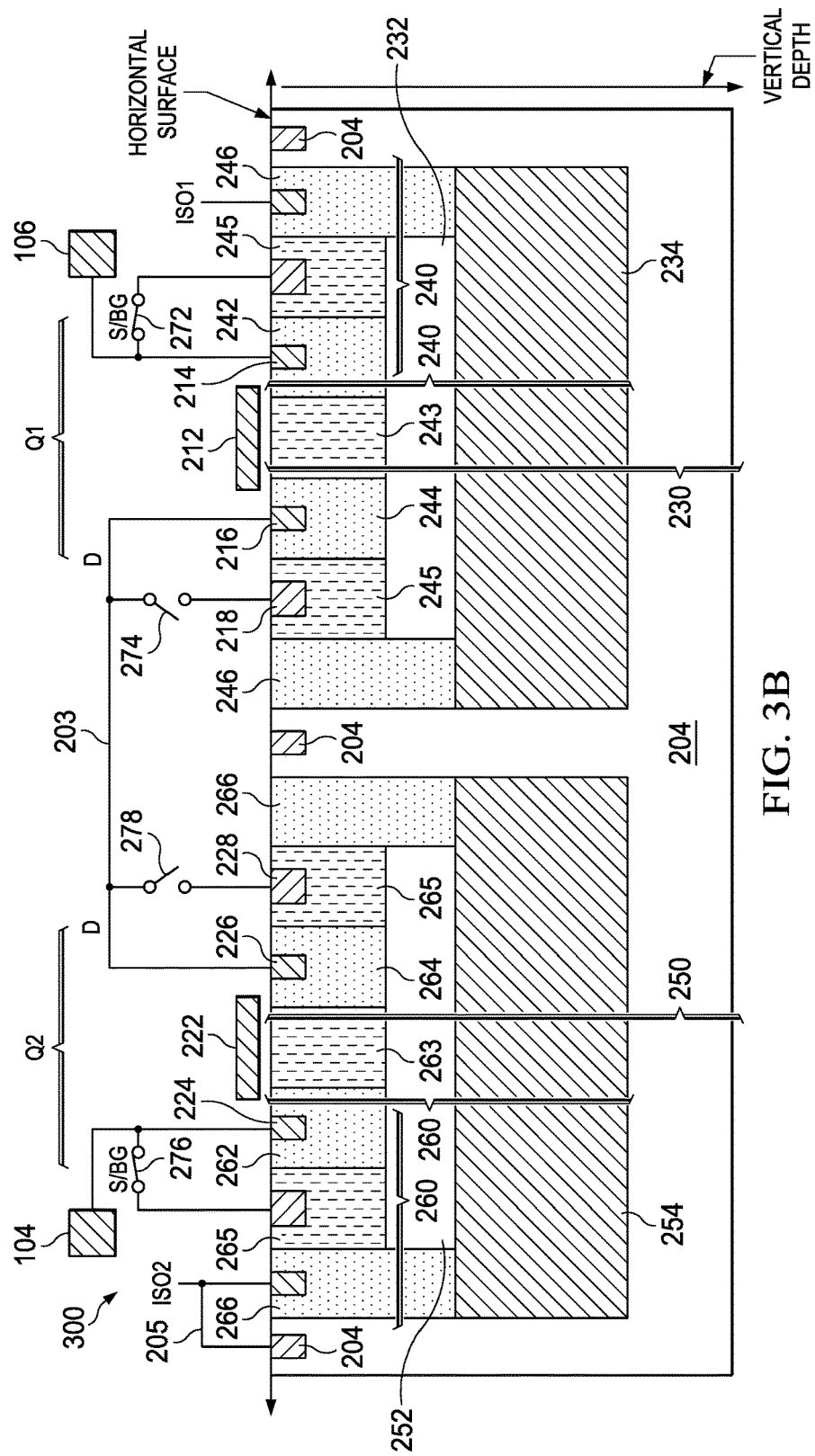
FIG. 3B shows a cross-sectional view of the LS driver circuit with power down protection according to an aspect of the present disclosure.

Due to these connection rearrangements, the parasitic structures (e.g., 230, 240, 250, and 260) of the LS driver circuit 300 demonstrates different characteristics during a power down mode when compared to its counterparts from the LS driver circuit 200. FIG. 3B shows a cross-sectional view of the LS driver circuit 300, which may better illustrate the structural relationship among the above referenced parasitic structures. The LS driver 300 has the same cross-sectional layout as the LS driver 200 although the connections of several doped regions are rearranged.

More specifically regarding the first transistor Q1, the first n-doped region 242 is connected to the second p-doped region 245. As such, the first n-doped region 242 shares the same potential with the second p-doped region 245 as they are both connected to the first output terminal 106. Within this configuration, the first n-doped region 242 serves as a source region instead of a drain region (or extended drain region if the first transistor Q1 is a DENMOS transistor) during the power down mode. The back gate terminal 218 is decoupled from the second terminal 216. Because of this rearrangement, the p-doped region (e.g., 243, 245, and 232) is no longer floating with the floating connection 203. Rather, the p-doped region (e.g., 243, 245, and 232) is coupled to the output terminal 106. The second n-doped region 244 is no longer coupled to the back gate terminal 218. Instead, the second n-doped region 244 serves as a drain region (or extended drain region if the first transistor Q1 is a DENMOS transistor) during the power down mode.

Regarding the second transistor Q2, the first n-doped region 262 is connected to the second p-doped region 265. As such, the first n-doped region 262 shares the same potential with the second p-doped region 265 as they are both connected to the LS voltage supply terminal 104. Within this configuration, the first n-doped region 262 serves as a source region instead of a drain region (or extended drain region if the first transistor Q1 is a DENMOS transistor) during the power down mode. The back gate terminal 228 is decoupled from the second terminal 226. Because of this rearrangement, the p-doped region (e.g., 263, 265, and 262) is no longer floating with the floating connection 203. Rather, the p-doped region (e.g., 263, 265, and 262) is coupled to the LS voltage supply terminal 104. The second n-doped region 264 is no longer coupled to the back gate terminal 228. Instead, the second n-doped region 264 serves as a drain region (or extended drain region if the first transistor Q1 is a DENMOS transistor) during the power down mode. To that end, the floating connection 203 is connected to the drain regions of the first transistor Q1 and the second transistor Q2. And the drain regions of the first and second transistors Q1 and Q2 are configured to float during the power down mode.

Referring again to the first transistor Q1, the p-doped region (e.g., 243, 245, and 232) is no longer floating but instead shares the same potential as the first n-doped region 242. Thus, the base region of the parasitic NPN structure 240 is no longer open. Because the emitter region and the base region of the NPN structure 240 is coupled together, these two regions share the same potential. Advantageously, the breakdown voltage $BV_{CES}$ of the NPN structure 240 is increased significantly. In one implementation, for example, the close-base breakdown voltage $BV_{CES}$ is at 20V, which is substantially greater than the open-base breakdown voltage $BV_{CEO}$ at 6V. The large breakdown voltage $BV_{CES}$ prevents the parasitic NPN structure 240 from conducting current even when the output terminal 106 receives a large voltage ramp (e.g., from −12V to +12V) during the power down mode. The configuration adopted by the LS driver circuit 300 thus helps suppress the NPN structure 240 from contributing to the positive feedback of the parasitic SCR structure. Advantageously, the LS driver circuit 300 can withstand high voltage swing (both positive and negative), prevent sinking and sourcing large load current, and avoid entering into a low resistance mode during power down operations.

The configuration adopted by the LS driver circuit 300 can be implemented by rerouting the interconnects wires as shown in FIGS. 2A and 2B. Alternatively, this configuration adopted by the LS driver circuit 300 can be implemented by two additional sets of switches. The first set of switches includes a first switch 272 and a second switch 274. The first switch 272 is coupled between the p-doped region 245 (e.g., the back gate region of the first transistor Q1) and the output terminal 106. The second switch 274 is coupled between the p-doped region 245 (e.g., the back gate region of the first transistor Q1) and the floating connection (floating lead) 203. During a power on mode, where the LS driver circuit 300 is enabled and configured to drive the output terminal 106, the first switch 272 is configured to open while the second switch 274 is configured to close. As such, the back gate region (e.g., 245) of the first transistor Q1 is coupled to the floating lead 203 and decoupled from the output terminal 106. During a power down mode, where the LS driver circuit 300 is either in tristate or disabled, the first switch 272 is configured to close while the second switch 274 is configured to open. As such, the back gate region (e.g., 245) of the first transistor Q1 is coupled to the output terminal 106 and decoupled from the floating lead 203.

Likewise, the second set of switches includes a first switch 276 and a second switch 278. The first switch 276 is coupled between the p-doped region 265 (e.g., the back gate region of the second transistor Q2) and the LS voltage supply terminal 104. The second switch 278 is coupled between the p-doped region 265 (e.g., the back gate region of the second transistor Q2) and the floating connection (floating lead) 203. During a power on mode, where the LS driver circuit 300 is enabled and configured to drive the output terminal 106, the first switch 276 is configured to open while the second switch 278 is configured to close. As such, the back gate region (e.g., 265) of the second transistor Q2 is coupled to the floating lead 203 and decoupled from the LS voltage supply terminal 104. During a power down mode, where the LS driver circuit 300 is either in tristate or disabled, the first switch 276 is configured to close while the second switch 278 is configured to open. As such, the back gate region (e.g., 265) of the second transistor Q2 is coupled to the LS voltage supply terminal 104 and decoupled from the floating lead 203.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit, comprising:
    a substrate having a horizontal surface;
    a voltage supply terminal;
    an output terminal;
    a first transistor including a first n-doped region coupled to the output terminal, a first p-doped region surrounding the first n-doped region and coupled to the output terminal, and a second n-doped region separated from the first n-doped region by the first p-doped region;
    a second transistor including a third n-doped region, a second p-doped region surrounding the third n-doped region and coupled to the voltage supply terminal, and a fourth n-doped region separated from the third n-doped region by the second p-doped region, the fourth n-doped region coupled to the voltage supply terminal;
    a floating lead coupled between the second and third n-doped regions;
    a first switch coupled between the first p-doped region and the output terminal; and
    a second switch coupled between the first p-doped region and the floating lead.

2. The integrated circuit of claim 1, wherein the first transistor includes a metal oxide semiconductor transistor having:
    a drain region in the second n-doped region;
    a source region in the first n-doped region;
    a channel region in the first p-doped region and between the drain region and the source region; and
    a gate structure positioned above the channel region.

3. The integrated circuit of claim 1, wherein the second transistor includes a metal oxide semiconductor transistor having:
    a drain region in the third n-doped region;
    a source region in the fourth n-doped region;
    a channel region in the second p-doped region and between the drain region and the source region; and
    a gate structure positioned above the channel region.

4. The integrated circuit of claim 1, wherein the first transistor includes a drain extended metal oxide semiconductor transistor having:
    an extended drain region in the second n-doped region;
    a source region in the first n-doped region;
    a channel region in the first p-doped region and between the extended drain region and the source region; and
    a gate structure positioned above the channel region.

5. The integrated circuit of claim 1, wherein the second transistor includes a drain extended metal oxide semiconductor transistor having:
    an extended drain region in the third n-doped region;
    a source region in the fourth n-doped region;
    a channel region in the second p-doped region and between the extended drain region and the source region; and
    a gate structure positioned above the channel region.

6. The integrated circuit of claim 1, wherein the first p-doped region includes:
    a p-doped channel region positioned between the first and second n-doped regions;
    a p-doped side region laterally surrounding the first and second n-doped regions; and
    a p-doped buried layer supporting and connecting the p-doped channel region and the p-doped side region.

7. The integrated circuit of claim 1, further comprising:
    a first n-doped buried layer positioned on the substrate;
    a second n-doped buried layer positioned on the substrate and isolated from the first n-doped buried layer;
    a first n-doped side wall laterally surrounding the first p-doped region, the first n-doped side wall supported by the first n-doped buried layer; and
    a second n-doped side wall laterally surrounding the second p-doped region, the second n-doped side wall supported by the second n-doped buried layer.

8. An interface device, comprising:
    a p-doped substrate having a horizontal surface and a vertical depth extending perpendicular to the horizontal surface;
    a high-side (HS) voltage supply terminal;
    a low-side (LS) voltage supply terminal;
    an output terminal;
    a HS driver circuit coupled between the HS voltage supply terminal and the output terminal; and
    a LS driver circuit including:
        a first transistor including a first n-doped region coupled to the output terminal, a first p-doped region surrounding the first n-doped region and coupled to the output terminal, and a second n-doped region separated from the first n-doped region by the first p-doped region;
        a second transistor including a third n-doped region, a second p-doped region surrounding the third n-doped region and coupled to the LS voltage supply terminal, and a fourth n-doped region separated from the third n-doped region by the second p-doped region, the fourth n-doped region coupled to the LS voltage supply terminal;
        a floating lead coupled between the second and third n-doped regions
        a first switch coupled between the first p-doped region and the output terminal; and
        a second switch coupled between the first p-doped region and the floating lead.

9. The interface device of claim 8, further comprising:
    a first PNP structure along the vertical depth, the first PNP structure including the first p-doped region, a first n-doped layer under the first p-doped region, and the p-doped substrate; and
    a second PNP structure along the vertical depth, the second PNP structure including the second p-doped region, a second n-doped layer under the second p-doped region and isolated from the first n-doped layer, and the p-doped substrate.

10. An integrated circuit, comprising:
    a voltage supply terminal;
    an output terminal;
    a first transistor including a first n-doped region coupled to the output terminal, a first p-doped region surrounding the first n-doped region and coupled to the output terminal, and a second n-doped region separated from the first n-doped region by the first p-doped region;
    a second transistor including a third n-doped region, a second p-doped region surrounding the third n-doped region and coupled to the voltage supply terminal, and a fourth n-doped region separated from the third n-doped region by the second p-doped region, the fourth n-doped region coupled to the voltage supply terminal;
    a common gate terminal directly coupled to the first transistor and the second transistor;
    a floating lead coupled between the second and third n-doped regions; and
    a first switch coupled between the first p-doped region and the output terminal; and
    a second switch coupled between the first p-doped region and the floating lead.

11. The integrated circuit of claim 10, wherein the first transistor includes a metal oxide semiconductor transistor having:
    a drain region in the second n-doped region;
    a source region in the first n-doped region;
    a channel region in the first p-doped region and between the drain region and the source region; and
    a gate structure positioned above the channel region.

12. The integrated circuit of claim 10, wherein the second transistor includes a metal oxide semiconductor transistor having:
    a drain region in the third n-doped region;
    a source region in the fourth n-doped region;
    a channel region in the second p-doped region and between the drain region and the source region; and
    a gate structure positioned above the channel region.

13. The integrated circuit of claim 10, wherein the first transistor includes a drain extended metal oxide semiconductor transistor having:
    an extended drain region in the second n-doped region;
    a source region in the first n-doped region;
    a channel region in the first p-doped region and between the extended drain region and the source region; and
    a gate structure positioned above the channel region.

14. The integrated circuit of claim 10, wherein the second transistor includes a drain extended metal oxide semiconductor transistor having:
    an extended drain region in the third n-doped region;
    a source region in the fourth n-doped region;
    a channel region in the second p-doped region and between the extended drain region and the source region; and
    a gate structure positioned above the channel region.

15. The integrated circuit of claim 10, wherein the first p-doped region includes:
    a p-doped channel region positioned between the first and second n-doped regions;
    a p-doped side region laterally surrounding the first and second n-doped regions; and
    a p-doped buried layer supporting and connecting the p-doped channel region and the p-doped side region.

16. The integrated circuit of claim 10, further comprising:
    a substrate;
    a first n-doped buried layer positioned on the substrate;

a second n-doped buried layer positioned on the substrate and isolated from the first n-doped buried layer;

a first n-doped side wall laterally surrounding the first p-doped region, the first n-doped side wall supported by the first n-doped buried layer; and a second n-doped side wall laterally surrounding the second p-doped region, the second n-doped side wall supported by the second n-doped buried layer.

* * * * *